United States Patent [19]

Sugimoto et al.

[11] Patent Number: 4,742,024
[45] Date of Patent: May 3, 1988

[54] SEMICONDUCTOR DEVICE AND METHOD OF PRODUCING SEMICONDUCTOR DEVICE

[75] Inventors: Masahiro Sugimoto, Yokosuka; Yasumasa Wakasugi; Shigeki Harada, both of Kawasaki, all of Japan

[73] Assignee: Fujitsu Limited, Kawasaki, Japan

[21] Appl. No.: 76,762

[22] Filed: Jul. 23, 1987

Related U.S. Application Data

[62] Division of Ser. No. 937,414, Dec. 3, 1986, Pat. No. 4,698,663.

[30] Foreign Application Priority Data

Sep. 17, 1986 [JP] Japan ................. 61-218301

[51] Int. Cl.[4] ............ H01L 23/02; H01L 39/02
[52] U.S. Cl. .................... 437/211; 437/209; 437/218; 27/737; 27/740; 174/52 FP; 174/16 HS; 357/81; 357/80
[58] Field of Search ........... 437/211, 209, 218; 29/739, 740; 174/52 FP, 16 HS; 357/81, 80, 74, 75, 79; 165/80, 105

[56] References Cited

U.S. PATENT DOCUMENTS

| | | | |
|---|---|---|---|
| 3,171,067 | 2/1960 | Trert ........................ | 437/209 |
| 3,249,982 | 1/1963 | Van Couvering et al. ........ | 437/209 |
| 3,735,211 | 5/1973 | Kapnias .................... | 437/218 |
| 4,069,498 | 1/1978 | Joshi ....................... | 357/81 |
| 4,340,902 | 7/1982 | Honda et al. ............... | 357/81 |
| 4,396,935 | 8/1983 | Schuck ..................... | 357/74 |
| 4,493,143 | 1/1985 | Maier ...................... | 437/209 |
| 4,561,011 | 12/1985 | Kohara et al. .............. | 357/81 |
| 4,620,215 | 10/1986 | Lee ........................ | 357/81 |
| 4,620,216 | 10/1986 | Horvath .................... | 357/82 |
| 4,626,960 | 12/1986 | Hamano et al. .............. | 357/80 |

Primary Examiner—Brian E. Hearn
Assistant Examiner—Beverly A. Pawlikowski
Attorney, Agent, or Firm—Staas & Halsey

[57] ABSTRACT

A semiconductor device comprises a substrate, a semiconductor element mounted on the substrate, a cap having an opening smaller than the external size of the semiconductor element for covering the semiconductor element to provide a hermetic seal, and a heatsink member mounted on the cap to cover the opening and to make contact with the semiconductor element via the opening, so that heat generated by the semiconductor element is conducted directly to the heatsink member. A method of producing the semiconductor device comprises the steps of mounting the semiconductor element on the substrate, covering the semiconductor element by the cap which is fixed to the substrate, and mounting the heatsink member on the cap to cover the opening and to make contact with the semiconductor element via the opening.

4 Claims, 8 Drawing Sheets

SEMICONDUCTOR DEVICE AND METHOD OF PRODUCING SEMICONDUCTOR DEVICE

This is a division of co-pending application Ser. No. 937,414 filed on Dec. 3, 1986, now U.S. Pat. No. 4,698,663, issued Oct. 6, 1987.

BACKGROUND OF THE INVENTION

The present invention generally relates to semiconductor devices and methods of producing semiconductor devices, and more particularly to a semiconductor device provided with a cap and a heatsink member and a method of producing such a semiconductor device.

Conventionally, a semiconductor element (flip-chip) having solder bumps or a semiconductor element having minute leads projecting to the periphery thereof is electrically coupled face downward to a multilevel interconnection layer (multilevel wiring layer) on a substrate and is fixed thereon. The semiconductor element is covered on the top surface of the substrate, and the semiconductor element is hermetically sealed by the cap. A heatsink is fixed on the cap. The heat generated by the semiconductor element is once conducted in a direction along the width of the cap and reaches the heatsink, and the heat is conducted within the heatsink and is radiated from the surface of the heatsink.

Generally, the cap is made of KOVAR (registered trademark) when the coefficient of thermal expansion and the processing facility are considered. However, the thermal conductivity of KOVAR is approximately 20 W/m·K and is unsatisfactory. For this reason, in the semiconductor device having the above described construction, the cap acts as a resistance with respect to the thermal conduction and is an obstacle to the improvement of the heat radiating efficiency.

It is possible to conceive a construction in which the heatsink is mounted directly on the semiconductor element so as to improve the heat radiating efficiency, but in this case, it is difficult to obtain a perfect hermetic seal and to miniaturize the semiconductor device as a whole.

As another example of the conventional semiconductor device, there is a semiconductor device comprising a cap made of a material having a low thermal expansion coefficient for covering semiconductor elements, where the cap has Cu embedded portions having a high thermal conductance. Such a semiconductor device is disclosed in IBM Technical Disclosure Bulletin, Vol. 26, No. 7A, December 1983. According to this semiconductor device, a solid column made of a high thermal conductance material is located on each semiconductor element and is in contact with the corresponding Cu embedded portion of the cap. The heat generated by the semiconductor element is conducted via the solid column and the Cu embedded portion of the cap. However, according to this semiconductor device, there is a problem in that the processes of producing the cap is complex in that holes must be formed in the cap and the Cu embedded portions must be embedded in the holes. In addition, when the height of the semiconductor elements and the height of the solid column are inconsistent, a satisfactory contact may not be obtained between the semiconductor element and the solid column and between the solid column and the Cu embedded portion of the cap. However, when the cap is soldered on a substrate which has the semiconductor elements located thereon, it is virtually impossible to check whether or not the satisfactory contacts are obtained on the inside of the cap. Furthermore, since the solid column is located between the semiconductor element and the Cu embedded portion of the cap, it is impossible to reduce the height of the cap and the semiconductor device as a whole cannot be miniaturized.

SUMMARY OF THE INVENTION

Accordingly, it is a general object of the present invention to provide a novel and useful semiconductor device and a method of producing the semiconductor device, in which the problems described heretofore are eliminated.

Another and more specific object of the present invention is to provide a semiconductor device comprising a substrate, a semiconductor element mounted on the substrate, a cap having an opening smaller than the external size of the semiconductor element for covering the semiconductor element to provide a hermetic seal, and a heatsink member mounted on the cap to cover the opening and to make contact with the semiconductor element via the opening. According to the semiconductor device of the present invention, the heat radiating efficiency is improved because the heat generated by the semiconductor element is conducted directly to the heatsink member and not via the cap. In addition, it is possible to obtain a satisfactory hermetic seal for the semiconductor element because the opening in the cap is smaller than the external size of the semiconductor element, and the semiconductor device as a whole can be miniaturized because of the contact between the semiconductor element and the heatsink member.

Still another object of the present invention is to provide a method of producing a semiconductor device comprising the steps of mounting a semiconductor element on a substrate, covering the semiconductor element by a cap which is fixed to the substrate and has an opening smaller than the external size of the semiconductor element, and mounting a heatsink member on the cap to cover the opening and to make contact with the semiconductor element via the opening. According to the method of the present invention, it is possible to check via the opening of the cap before the heatsink member is mounted whether or not the cap is correctly fixed on the substrate.

Other objects and further features of the present invention will be apparent from the following detailed description when read in conjunction with the accompanying drawings.

DETAILED DESCRIPTION

First, description will be given with respect to a first embodiment of the semiconductor device according to the present invention, by referring to FIGS. 1 through 7.

Figure 1:
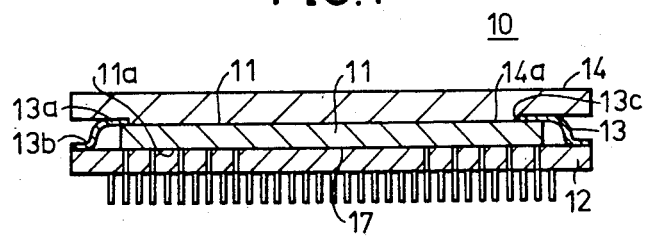
FIG. 1 is a cross sectional view showing a first embodiment of the semiconductor device according to the present invention.
Figure 2:
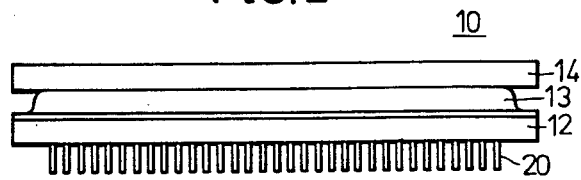
FIGS. 2, 3 and 4 are a front view, a plan view with a part of a heatsink member cut away and a bottom view respectively showing the first embodiment of the semiconductor device according to the present invention.
Figure 3:
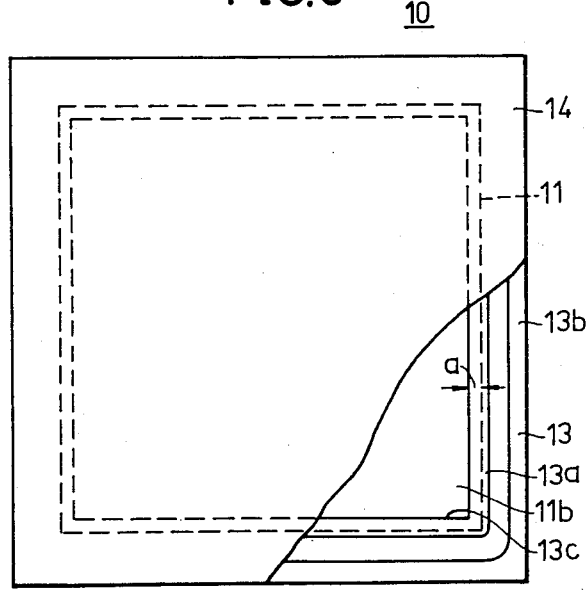
Figure 5:
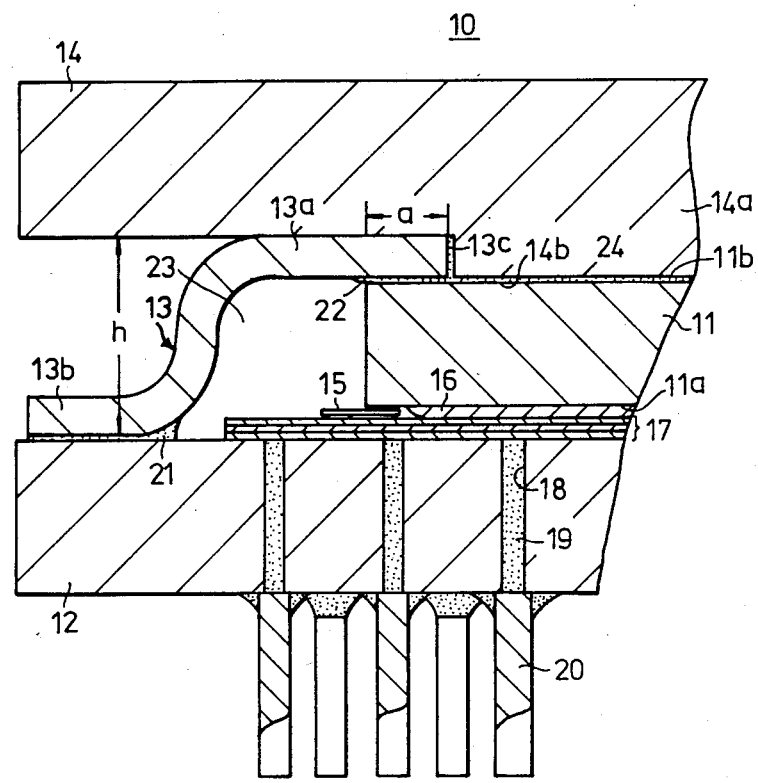
FIG. 5 is an enlarged view showing a left end part of the semiconductor device shown in FIG.1.
Figure 6:
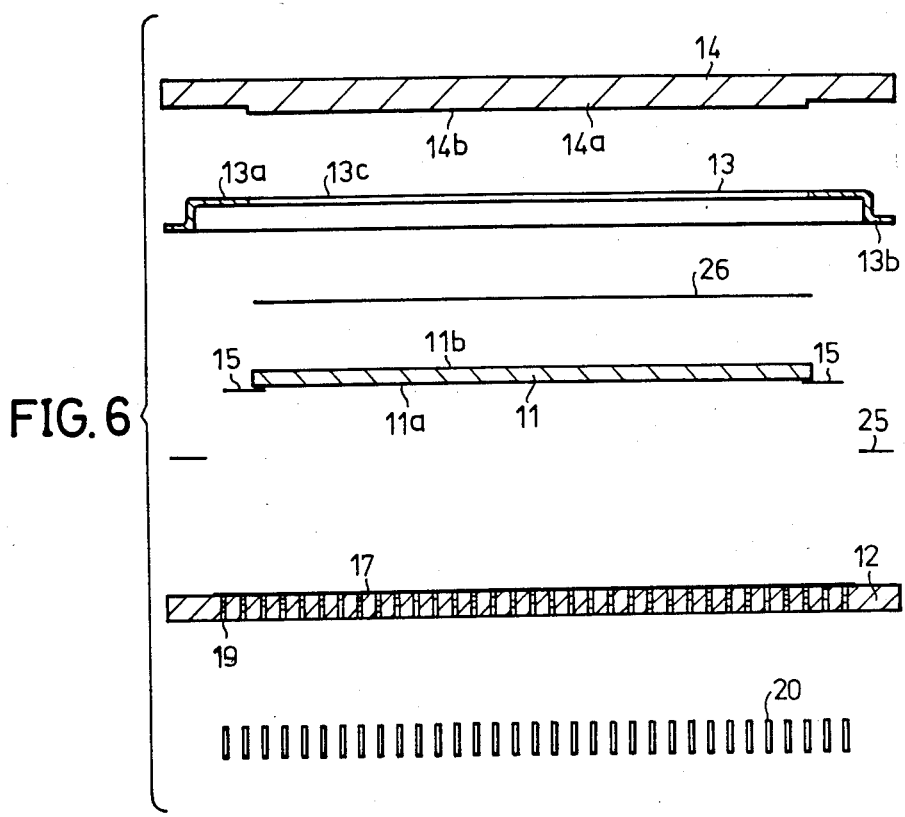
FIG. 6 is a disassembled view showing the semiconductor device shown in FIG. 1.

As shown in FIGS. 1, 2 and 6, a semiconductor device 10 generally comprises a semiconductor element 11, a substrate 12, a cap 13, and a heatsink member 14. A plurality of minute leads 15 extend outwardly for 0.7 mm, for example, from a periphery of a top face 11a of the semiconductor element 11 as shown in FIG. 6. Circuit elements or circuits are formed on the top face 11a, and a polyimide resin layer 16 having a thickness of 50 μm to 100 μm for example, is formed as shown in FIG. 5 as a measure against α-rays.

The semiconductor element 11 is placed face downward on a multilevel interconnection layer (multilevel wiring layer) 17 which is formed on the top surface of the substrate 12, that is, so that a bottom face 11b of the semiconductor element 11 faces up and the top face 11a faces down, as shown in FIGS. 5 and 6. The semiconductor element 11 is electrically and mechanically coupled to the multilevel interconnection layer 17 without the use of wires. As shown in FIG. 5, the multilevel interconnection layer 17 comprises three to four layers of wiring patterns laminated via insulator layers made of polyimide resin and having a thickness of 10 μm.

The substrate 12 is made of AlN, SiC, or Al$_2$O$_3$ and has a thickness of 0.6 mm, for example. As shown in FIGS. 1, 5 and 6, a plurality of via holes 18 penetrate the substrate 12, and a metal such as Mo and W is filled into the via holes 18 and a metallization is carried out to form sintered metal portions 19 in the via holes 18. A plurality of pins 20 are provided on the bottom surface of the substrate 12 by soldering or brazing and are fixed in correspondence with the sintered metal portions 19. The leads 15 are electrically coupled to the corresponding pins 20 via the corresponding sintered metal portions 19 and the multilevel interconnection layer 17.

Figure 4:
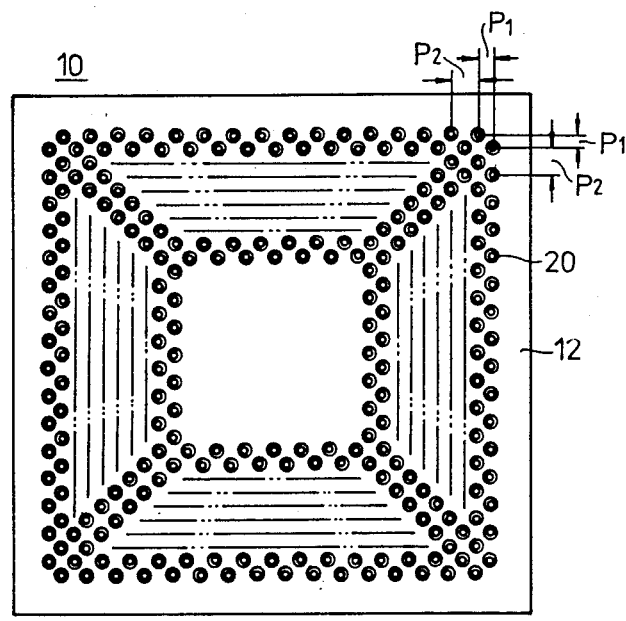

The pins 20 are made of Ni-plated KOVAR (registered trademark), Ni-plated Be-Cu or Ni-plated W. For example, the pins 20 have a diameter of 0.1 mm to 0.15 mm and a length of 1.0 mm to 1.5 mm. As shown in FIG. 4, the pins 20 are arranged on the substrate 12 at portions excluding the central portion and the outer peripheral portion, with pitches P$_1$ and P$_2$ respectively selected to 0.45 mm and 0.90 mm, for example.

Figure 7:
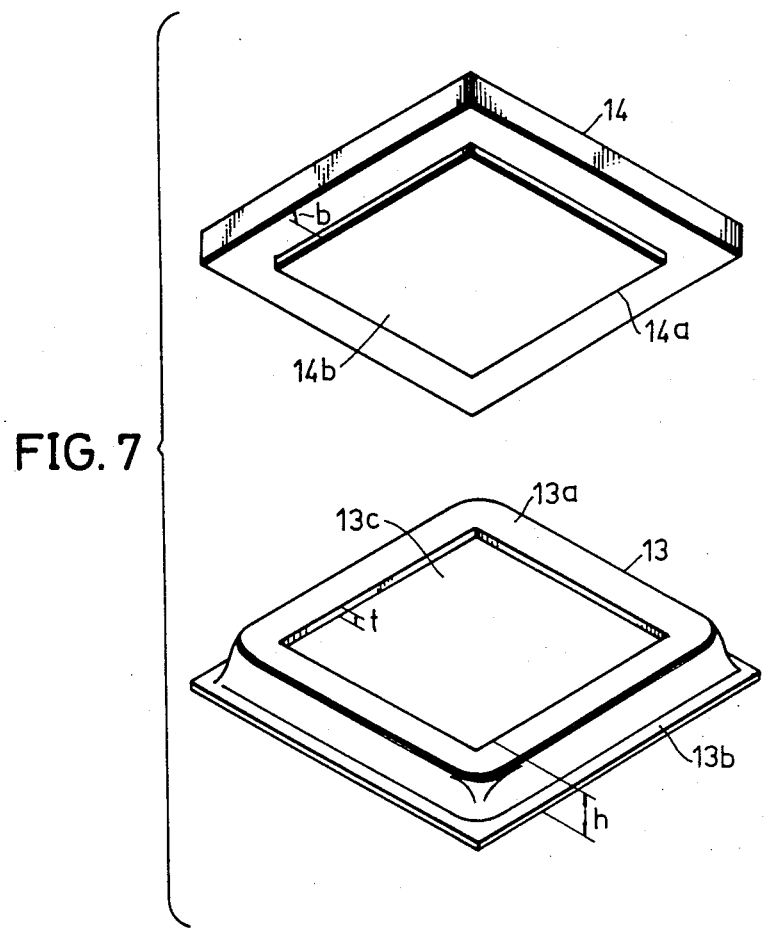
FIG. 7 is a perspective view showing a cap and a heatsink member in correspondence with each other.

The cap 13 is made of KOVAR, for example, and has a generally inverted rectangular tray shape. The cap 13 comprises a generally rectangular raised portion 13a, a flange portion 13b and a rectangular opening 13c formed in the center of the raised portion 13a as shown in FIG. 7. The opening 13c is smaller than the external size of the semiconductor element 11. As shown in FIGS. 1 and 5, the flange portion 13b is soldered on the substrate 12 by a solder 21, and the portion of the raised portion 13a around the periphery of the opening 13c is fixedly soldered on top (bottom face 11b) of the semiconductor element 11 by a solder 22. Accordingly, the semiconductor element 11 is hermetically sealed and is packaged within a compact package. The raised portion 13a overlaps the top of the semiconductor element 11 for a distance a of 0.5 mm, for example. A space 23 surrounding the semiconductor element 11 is filled with nitrogen or hydrogen gas, for example.

Because the cap 13 has the opening 13c, it is possible to check via the opening 13c to determine whether or not the semiconductor element 11 has a predetermined height and the cap 13 is satisfactorily soldered on top of the semiconductor element 11. In the case where the connection between the cap 13 and the semiconductor element 11 is unsatisfactory, it is possible to correct the connection by soldering via the opening 13c. The size of the cap 13 can be miniaturized because the cap 13 makes contact with the top of the semiconductor element 11.

As may be seen from FIGS. 2 and 7, the heatsink member 14 has the same size as the substrate 12. The heatsink member 14 is a rectangular plate member having a thickness of 0.8 mm, for example, and a flat stepped portion 14a is formed on the lower surface of the heatsink member 14. The stepped portion 14a has a shape in correspondence with the opening 13c of the cap 13, and projects for a distance b from the lower surface of the heatsink member 14. The distance b is approximately equal to a thickness t of the cap 13. The heatsink member 14 covers the cap 13 so that the stepped portion 14a fits into the opening 13c and a vertex surface 14b of the stepped portion 14a is soldered on the bottom face 11b of the semiconductor element 11 by a solder 24.

The heatsink member 14 is made of Mo, Cu, Al, AlN or SiC. The thermal conductivities of Mo, Cu, Al, AlN and SiC are 136 W/m·K, 394 W/m·K, 239 W/m·K, 150 to 200 W/m·K, and 170 to 270 W/m·K, respectively, and are higher than the thermal conductivity of KOVAR. In the case where the heatsink member 14 is made of AlN or SiC, Ni or Au is metallized on the vertex surface 14b.

The semiconductor device 10 is connected to a printed circuit (not shown) by connecting the pins 20 to corresponding wiring patterns of the printed circuit. For example, the printed circuit having the semiconductor device 10 connected thereto is assembled within a computer (not shown), and a contact and cooling means (not shown) makes contact with the top surface of the heatsink member 14.

The heat generated by the semiconductor element 11 when the computer is operated is conducted directly to the heatsink member 14 and not via the cap 13. The heat is conducted within the heatsink member 14 and is radiated from the top surface of the heatsink member 14. In other words, the heat generated by the semiconductor element 11 is more effectively radiated compared to the conventional device because the cap 13 which acts as a resistance does not exist between the semiconductor element 11 and the contact and cooling means.

Next, description will be given with respect to an embodiment of the method of producing the semiconductor device 10 by referring to FIG. 6. First, description will be given with respect to the processes of producing the substrate 12. The via holes 18 are formed in a so-called green sheet which is essentially a ceramic sheet, and metal powder such as Mo and W powder is filled into the via holes 18. The green sheet is then baked. The metal powder inside the via holes 18 is sintered, and the substrate 12 is obtained.

Then, a thin or thick conductive film is formed on the bottom surface of the substrate 12 to provide a pad for the pins 20, and the pins 20 are fixed to the bottom surface of the substrate 12 by soldering or brazing.

Next, the multilevel interconnection layer 17 is formed on the top surface of the substrate 12.

Thereafter, the semiconductor element 11 is mounted on the multilevel interconnection layer 17.

Then, a preformed solder 25 having a rectangular frame shape and a thickness of 50 μm to 100 μm, for example, is placed on the top surface of the substrate 12 under a nitrogen or hydrogen gas atmosphere, a preformed solder 26 having a thickness of 100 μm to 200 μm, for example, is placed on top of the semiconductor element 11, the cap 13 is placed on the substrate 12, the heatsink member 14 is placed on the cap 13, and these elements are heated to 300° C. to 330° C., for example.

Accordingly, the preformed solders 25 and 26 reflow, and the cap 13 and the heatsink member 14 are simultaneously fixed by the soldering. At the same time, the semiconductor element 11 is hermetically sealed by the cap 13. The preformed solder 25 constitutes the solder 21, and the preformed solder 26 constitutes the solders 22 and 24.

The cap 13 is a pressed member and a distance h between the raised portion 13a and the flange 13b can be accurately set. In addition, even when the height of the the semiconductor element 11 is inconsistent, it is possible to check via the opening 13c the connection between the cap 13 and the preformed solder 26 and appropriately select the thickness of the preformed solder 26 so as to obtain the optimum connection. For this reason, it is possible to set the positional relationship of the cap 13, the substrate 12 and the semiconductor element 11 with a high accuracy, and the cap 13 can be soldered on the substrate 12 and on the semiconductor element 11 satisfactorily.

The heatsink member 14 can be fixed on the cap 13 with ease and with a high accuracy because the stepped portion 14a fits into the opening 13c.

Therefore, the semiconductor device 10 can be produced by simple processes and is especially suited for mass production.

In the present embodiment, the semiconductor element 11, the cap 13 and the heatsink member 14 are simultaneously soldered by the preformed solder 26. However, as a modification of this method, it is possible to first solder the cap 13 on the semiconductor element 11, check the connection between the cap 13 and the semiconductor element 11 via the opening 13c, and then mount the heatsink member 14 on the cap 13. The connection between the cap 13 and the semiconductor element 11 can be corrected if the connection is unsatisfactory when the checking is carried out via the opening 13c. According to this modification, it is possible to produce a semiconductor device which is hermetically sealed with an extremely high reliability.

Furthermore, instead of using the semiconductor element 11, it is of course possible to use a flip-chip having solder bumps.

Figure 8:
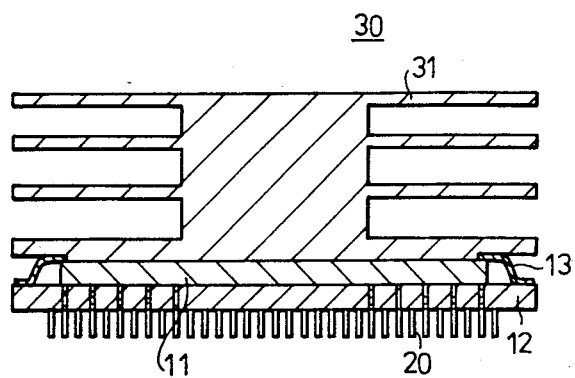
FIG. 8 is a cross sectional view showing a second embodiment of the semiconductor device according to the present invention.
Figure 9:
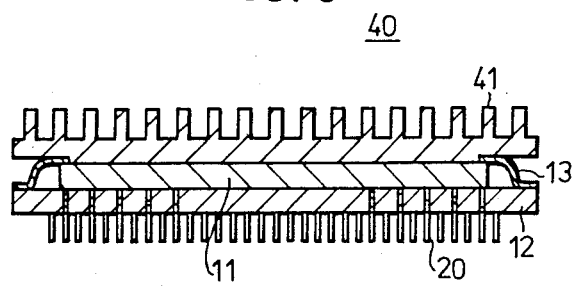
FIG. 9 is a cross sectional view showing a third embodiment of the semiconductor device according to the present invention.
Figure 10:
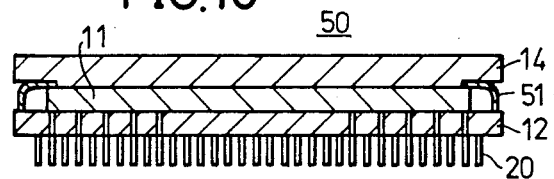
FIGS. 10 and 11 are a cross sectional view and a front view respectively showing a fourth embodiment of the semiconductor device according to the present invention.
Figure 11:
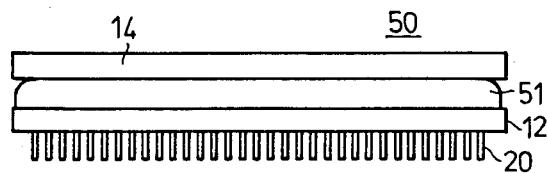
Figure 12:
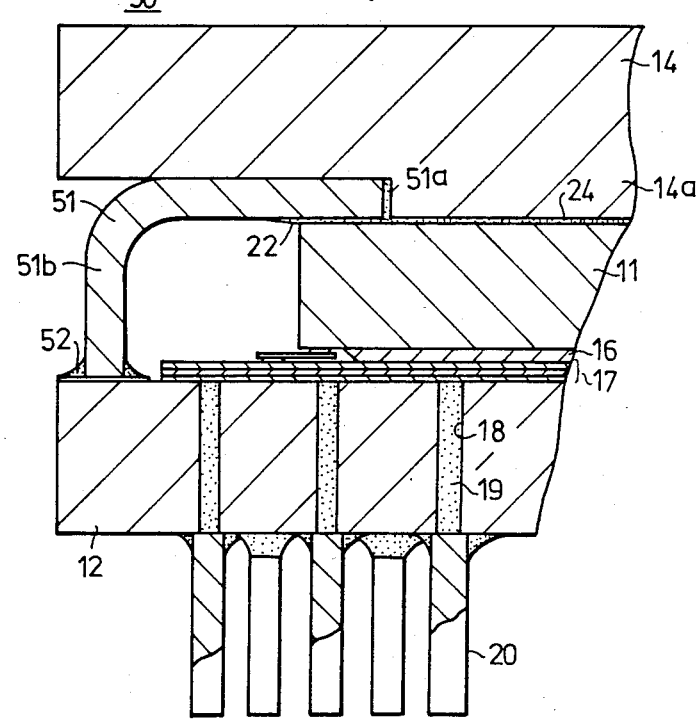
FIG. 12 is an enlarged view showing a left end part of the semiconductor device shown in FIG. 10.

FIGS. 8 and 9 respectively show second and third embodiments of the semiconductor device according to the present invention. The constructions of semiconductor devices 30 and 40 respectively shown in FIGS. 8 and 9 are basically the same as the construction of the semiconductor device 10 described heretofore except for the heatsink member. Hence, in FIGS. 8 and 9, those parts which are the same as those corresponding parts in FIG. 1 are designated by the same reference numerals, and description thereof will be omitted.

In the semiconductor device 30 shown in FIG. 8, fins 31 are fixedly soldered directly on the semiconductor element 11 as the heatsink member. The semiconductor device 30 is suited for use with an air cooled system.

In the semiconductor device 40 shown in FIG. 9, fins 41 are fixedly soldered directly on the semiconductor element 11 as the heatsink member. The semiconductor device 40 is suited for use with a liquid cooled system, that is, immersed in a coolant such as phlorocarbon.

FIGS. 10 through 13 show a fourth embodiment of the semiconductor device according to the present invention. The construction of a semiconductor device 50 is basically the same as the construction of the semiconductor device 10 except for the cap, and in FIGS. 10 through 13, those parts which are the same as those corresponding parts in FIGS. 1, 2 and 5 are designated by the same reference numerals, and description thereof will be omitted.

A cap 51 of the semiconductor device 50 has no flange portion corresponding to the flange portion 13b of the semiconductor device 10 described before. The portion of the cap 51 around the periphery of an opening 51a is soldered on top of the semiconductor element 11. The lower end of a vertical wall portion 51b of the cap 51 is soldered on the top surface of the substrate 12. The overall size of the semiconductor device 50 can be made more compact compared to that of the semiconductor device 10 because the cap 51 has no flange portion.

Figure 13:
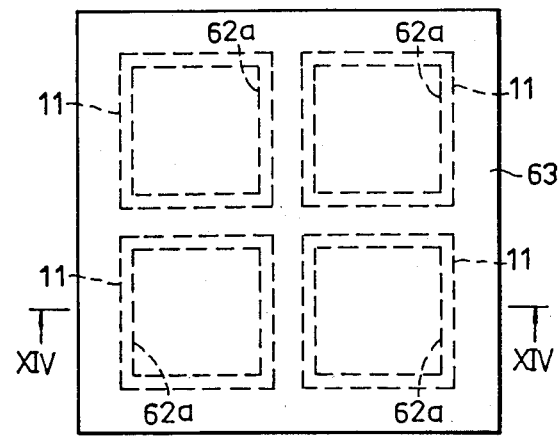
FIG. 13 is a plan view showing a fifth embodiment of the semiconductor device according to the present invention.
Figure 14:
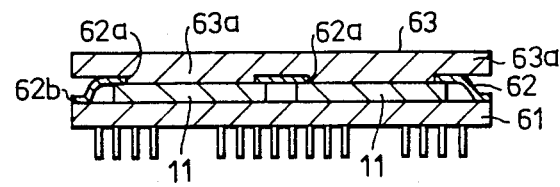
FIG. 14 is a cross sectional view of the semiconductor device along a line XIV—XIV in FIG. 13.

FIGS. 13 and 14 show a fifth embodiment of the semiconductor device according to the present invention. A semiconductor device 60 differs from the semiconductor device 10 in that four semiconductor elements 11 are mounted on a substrate 61. A cap 62 has four openings 62a in correspondence with the four semiconductor elements 11. Each opening 62a is smaller than the external size of the corresponding semiconductor element 11. The portions of the cap 62 around the periphery of the openings 62a are soldered on top of the corresponding semiconductor elements 11, and a flange portion 62b of the cap 62 is soldered on the substrate 61. Hence, the four semiconductor elements 11 are all hermetically sealed by the cap 61.

A heatsink member 63 comprises four stepped portions 63a in correspondence with the openings 62a. The heatsink member 63 covers the cap 61 so that each stepped portion 63a fits into the corresponding opening 62a and is soldered directly on top of the corresponding semiconductor element 11. Accordingly, each semiconductor element 11 is cooled via the heatsink member 63 similarly as in the case of the semiconductor device 10 described before.

Further, the present invention is not limited to these embodiments, but various variations and modifications may be made without departing from the scope of the present invention.

What is claimed is:

1. A method of producing a semiconductor device comprising the steps of:

forming a wiring layer on a top surface of a substrate;

mounting at least one semiconductor element with a top face thereof downward on said substrate and electrically coupled to said wiring layer;

placing first and second preformed solders on said substrate and on a bottom face of said semiconductor element;

placing a cap on said substrate, said cap having at least one opening which is smaller than an external size of said semiconductor element, a peripheral portion of said cap resting on the top surface of said substrate via said first preformed solder and a portion of said cap around said opening resting on the bottom face of said semiconductor element via said first preformed solder;

placing a heatsink member on said cap, said heatsink member having a portion which fits into said opening and rests on the bottom face of said semiconductor element; and heating said semiconductor device to reflow said second preformed solder to thereby hermetically seal said semiconductor element.

2. A method of producing a semiconductor device as claimed in claim 1 in which said step of placing first and second preformed solder places said first preformed solder on the top surface of said substrate around a periphery of said semiconductor element and places said second preformed solder on the entire bottom face of said semiconductor element, said step of placing heatsink member placing said heatsink member on said cap so that the portion of said heatsink member fitted into said opening rests on the bottom face of said semiconductor element via said second preformed solder, said step of heating simultaneously fixing said cap and said heatsink member on said substrate.

3. A method of producing a semiconductor device as claimed in claim 1 which further comprises a step of checking via said opening of said cap before said heatsink member is placed on said cap whether or not a satisfactory connection is obtained between said cap and said first preformed solder on the bottom face of said semiconductor element.

4. A method of producing a semiconductor device comprising the steps of:

forming a wiring layer on a top surface of a substrate;

mounting at least one semiconductor element with a top face thereof downward on said substrate and electrically coupled to said wiring layer;

mounting a cap on said substrate, said cap having at least one opening which is smaller than an external size of said semiconductor element, a peripheral portion of said cap being soldered on the top surface of said substrate and a portion of said cap around said opening being soldered on the bottom face of said semiconductor element to thereby hermetically seal said semiconductor element;

checking whether or not a satisfactory connection is obtained between said cap and said semiconductor element;

mounting a heatsink member on said cap, said heatsink member having a portion which fits into said opening and is soldered on the bottom face of said semiconductor element.

* * * * *

UNITED STATES PATENT AND TRADEMARK OFFICE
CERTIFICATE OF CORRECTION

PATENT NO. : 4,742,024
DATED : MAY 3, 1988
INVENTOR(S) : MASAHIRO SUGIMOTO ET AL.

It is certified that error appears in the above-identified patent and that said Letters Patent is hereby corrected as shown below:

Col. 1, line 21, after "covered" insert --by a cap having the periphery thereof soldered.--.

Col. 3, line 29, "100 μm" should be --100 μm,--.

Col. 5, line 33, delete "the" (second occurrence).

Col. 6, line 16, "phlorocarbon" should be --fluorocarbon--.

Signed and Sealed this

Sixteenth Day of August, 1988

Attest:

DONALD J. QUIGG

Attesting Officer

Commissioner of Patents and Trademarks